United States Patent
Das

(10) Patent No.: US 10,581,438 B2
(45) Date of Patent: *Mar. 3, 2020

(54) DIGITALLY RECONFIGURABLE ULTRA-HIGH PRECISION INTERNAL OSCILLATOR

(71) Applicant: TEXAS INSTRUMENTS INCORPORATED, Dallas, TX (US)

(72) Inventor: Abhijit Kumar Das, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/730,787

(22) Filed: Oct. 12, 2017

(65) Prior Publication Data

US 2018/0054204 A1 Feb. 22, 2018

Related U.S. Application Data

(63) Continuation of application No. 15/296,082, filed on Oct. 18, 2016, now Pat. No. 9,825,637, which is a continuation of application No. 14/927,649, filed on Oct. 30, 2015, now Pat. No. 9,503,100.

(51) Int. Cl.
G06F 1/04 (2006.01)
H03L 7/02 (2006.01)

(52) U.S. Cl.
CPC . *H03L 7/02* (2013.01); *G06F 1/04* (2013.01)

(58) Field of Classification Search
CPC ..................................... H03L 7/02; G06F 1/04
See application file for complete search history.

(56) References Cited

U.S. PATENT DOCUMENTS

| | | | |
|---|---|---|---|
| 7,332,944 B2 | 2/2008 | Fujita et al. | |
| 7,498,891 B2 | 3/2009 | Manocha | |
| 7,528,673 B2 | 5/2009 | Shibuya et al. | |
| 8,130,044 B2 | 3/2012 | Bereza et al. | |
| 8,860,482 B1 | 10/2014 | Liu et al. | |
| 9,234,936 B1 | 1/2016 | Thakur et al. | |
| 9,503,100 B1 | 11/2016 | Das | |
| 9,825,637 B2 * | 11/2017 | Das | G06F 1/04 |

* cited by examiner

*Primary Examiner* — Ryan Johnson
(74) *Attorney, Agent, or Firm* — Ebby Abraham; Charles A. Brill; Frank D. Cimino

(57) ABSTRACT

A system, method and apparatus for tuning an internal oscillator to a desired frequency F1 is shown and uses an RC delay element that comprises a resistor, a capacitor and a comparator. The method includes receiving a clock signal from an oscillator to be tuned, triggering charging of the RC delay element, and N clock cycles after triggering the charging, the method determines whether the charge on the precision RC delay element is higher than or lower than a reference voltage. Correction to the clock frequency is based on the results.

12 Claims, 3 Drawing Sheets

DIGITALLY RECONFIGURABLE ULTRA-HIGH PRECISION INTERNAL OSCILLATOR

CROSS REFERENCE TO RELATED APPLICATION(S)

This continuation application claims priority to U.S. patent application Ser. No. 15/296,082, filed Oct. 18, 2016, which application claims priority to U.S. patent application Ser. No. 14/927,649, filed Oct. 30, 2015, both applications of which are hereby incorporated herein by reference in their entirety.

FIELD OF THE DISCLOSURE

Disclosed embodiments relate generally to the field of internal oscillators and more specifically to providing a given frequency with a high degree of precision with an oscillator.

BACKGROUND

Oscillators can be broadly classified into crystal oscillators and internal oscillators. A crystal oscillator can have a very stable frequency with precision as high as 1 or 2 parts per million (ppm). On the other hand, internal oscillators, which are built entirely on the silicon chip or with one or few external components (e.g., resistor, capacitors, inductors, etc.), cannot provide the same level of precision. With an internal oscillator, the best precision that can currently be achieved is in the range of 0.5-1.0%; greater precision is desirable.

To achieve high precision in an oscillator, a precision component is necessary, either inside or outside the correction loop. This precision component can be achieved using one or more external components, such as an off-chip resistor-capacitor combination, an internal component with trim, or a combination of these components. Trimming is an operation on a component to obtain a specific accuracy from that component. This operation can utilize a laser to physically burn off portions of a component or the design can provide multiple switches, which can be set after the manufacturing process to provide the desired result. It is nearly impossible and completely impractical to trim on-chip elements, such as resistors or capacitors, to very high accuracy, i.e., in the range of 0.1%. In an example of this difficulty, a 20K resistor with +−15% process variation will need 300 steps with 20Ω each. It is nearly impossible to realize a practical switch smaller than 20Ω by itself. If we cannot achieve high (~0.1%) accuracy in any internal component, we cannot build an oscillator with high precision using completely on-chip components.

Existing high precision solutions require precision analog modules, such as a very low offset comparator/amplifier, accurate switched capacitor sampling, or high quality switches. Additionally, these high precision solutions require a process trimmed precision analog RC. We have not previously had any method of trimming an internal Resistor-Capacitor (RC) time constant to 0.1%; therefore, we are not able to build a completely on-chip precision oscillator of that level of accuracy. Additionally, non-idealities like switch ON resistance, rise/fall time, incomplete settling, and parasitic coupling limit the accuracy beyond approximately 0.5% in reasonable practical implementation. In addition, for a chip containing multiple oscillators, every oscillator on the chip needs to be trimmed and tuned separately, which leads to high test costs. Further, when a high precision oscillator is tuned to one frequency, it is difficult to later tune the same oscillator to some other frequency with similar high accuracy. In some cases such retuning may be possible over a short range, but is difficult over larger frequency range.

SUMMARY

The present patent application discloses systems, methods, and devices that provide a high precision analog RC that can be used to realize oscillators that have 0.1% or better accuracy. In the disclosed design, the precision analog RC is not trimmed by physical methods, but rather is "trimmed" through the clock division ratio; therefore, depending on the division ratio utilized, a very precise clock can be realized. Because of the division, other errors introduced in the system are also attenuated, providing very high accuracy clock frequency. A Frequency Tuning Module (FTM) receives a clock signal from an internal, digitally controllable oscillator (DCO) that is to be tuned. Given a desired frequency for the oscillator, the FTM is programmed to know the number of clock periods, N, that are necessary for the capacitor in the precision analog RC circuit to be charged or discharged to a reference voltage when the frequency of the DCO is accurate. The frequency tuning module triggers the precision analog RC module; then after N clock periods, compares the charge on the precision analog RC module to the reference voltage. The frequency of the DCO is adjusted based on the comparison. By designing values in the precision analog RC module appropriately, the value of N can be 1000 or larger, which provides steps of 0.1% for tuning the frequency of the DCO. The value of N can be set based on the actual values of the RC module, rather than on designed values. Accordingly, the frequency of the DCO can be tuned quite precisely, regardless of the process variation in the DCO. Having only one rise/fall time for N clocks reduces the impact of the non-idealities by a factor of N and the comparator is clocked to reduce error contribution.

Overall the system is flexible and digitally reconfigurable. By providing a precision analog RC module having known characteristics, the frequency tuning module is able to tune each of the oscillators on a given chip to required frequencies with a precision previously impossible to achieve in an internal oscillator. The architecture is independent of DCO implementation. The disclosed solution is simple, inexpensive and practical. A single delay element (analog RC module) can be used to trim multiple clocks at multiple different frequencies, providing significant digital re-configurability.

In one aspect, an embodiment of a method of tuning an internal oscillator to a desired frequency F1 is disclosed. The method uses a precision RC delay element that comprises a resistor, a capacitor and a comparator. The method comprises receiving a clock signal from an oscillator to be tuned; triggering charging of the RC delay element; at M clock cycles from triggering the charging, obtaining a first result that indicates whether the voltage on the RC delay element is higher than or lower than a reference voltage; and providing corrective feedback to the oscillator based on the first result.

In another aspect, a further embodiment of a method of tuning an internal oscillator to a desired frequency F1 is disclosed. The method uses an RC delay element that comprises a resistor, a capacitor and a comparator. The method comprises receiving a clock signal from an oscillator to be tuned; triggering discharging of the RC delay element;

at M clock cycles from triggering the discharging, obtaining a result that indicates whether the voltage on the RC delay element is higher than or lower than a reference voltage; and providing corrective feedback to the oscillator based on the result.

In yet another aspect, an embodiment of an integrated circuit (IC) chip is disclosed. The IC chip comprises a frequency tuning module coupled to provide a control signal to an oscillator and to receive a clock signal from the oscillator; and a RC delay element comprising a digital buffer, a resistor, a capacitor and a comparator, the resistor being connected between the digital buffer and a first input of the comparator, a second input of the comparator receiving a reference voltage, the capacitor having a terminal connected between the resistor and the first input of the comparator, and the digital buffer being connected to receive a start trigger; wherein the frequency tuning module is configured to perform the following: triggering charging of the RC delay element; after M clock cycles from triggering the charging, obtaining a first result from the comparator; and providing corrective feedback to the oscillator based on the first result.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Specific embodiments of the invention will now be described in detail with reference to the accompanying Figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other.

Figure 1:
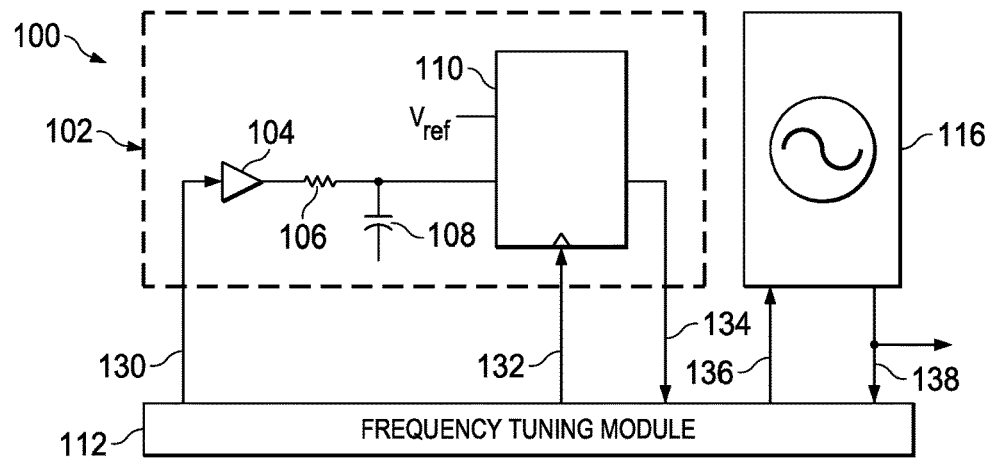
FIG. 1 depicts an example system for tuning an internal DCO to ultra-high precision according to an embodiment of the present patent application.

Referring now to the drawings and more particularly to FIG. 1, depicted therein is system 100 for tuning an internal DCO 116 to ultra-high precision according to an embodiment of the application. Frequency tuning module 112 is connected to provide a control signal 136 to internal DCO 116 and to receive a clock signal 138 from DCO 116. In at least one embodiment, internal DCO 116 is an inexpensive, low power DCO. In at least one embodiment, internal DCO 116 is a high performance DCO. Both types of DCO can achieve the same final frequency accuracy.

FTM 112 is connected to provide signals 130, 132 to precision RC delay element 102 and to receive signal 134 from precision RC delay element 102 as will be discussed in greater detail below. Precision RC delay element 102 contains digital buffer 104, which receives triggering signal 130 from FTM 112 to initiate charging of the circuit. Resistor 106 is connected between digital buffer 104 and a first input of comparator 110 and capacitor 108 has one terminal connected between resistor 106 and the first input of comparator 110. In one example embodiment, the value of resistor 106 is 752K and the value of capacitor 108 is 5.75 pF to realize a value of N=500 for a clock period of 120 MHz. Comparator 110 receives a reference voltage Vref on a second input and receives a signal from FTM 112 over connection 132 as a clock input. The result from comparator 110 is provided to FTM 112, indicating whether the charge on precision RC delay element 102 is greater than or less than Vref. In the disclosed embodiment, resistor 106 and capacitor 108 do not need to be trimmed, but are allowed to vary with the process. Instead, the value of N is compensated to 'trim' the RC process variation. In other words, once the chip is finished, the time, Tref, necessary for charging capacitor 108 via resistor 106 to a reference voltage, Vref, is precisely determined. This value, divided by the period associated with the desired frequency of the DCO 116, can be used to initialize N, which represents the number of clocks that occur in Tref seconds if the frequency of the DCO is correct. Using this method of "logical trimming" means that there is no switching or parasitic impact on precision RC delay element 102, allowing the delay element to be very accurate. By choosing the correct values of resistor 106 and capacitor 108, any value of N can be achieved. Although the circuit has been explained in terms of an RC network, it will be recognized that the disclosed concept can also be implemented using an inductor-capacitor (LC) circuit or simply a current charging a capacitor.

Figure 2:
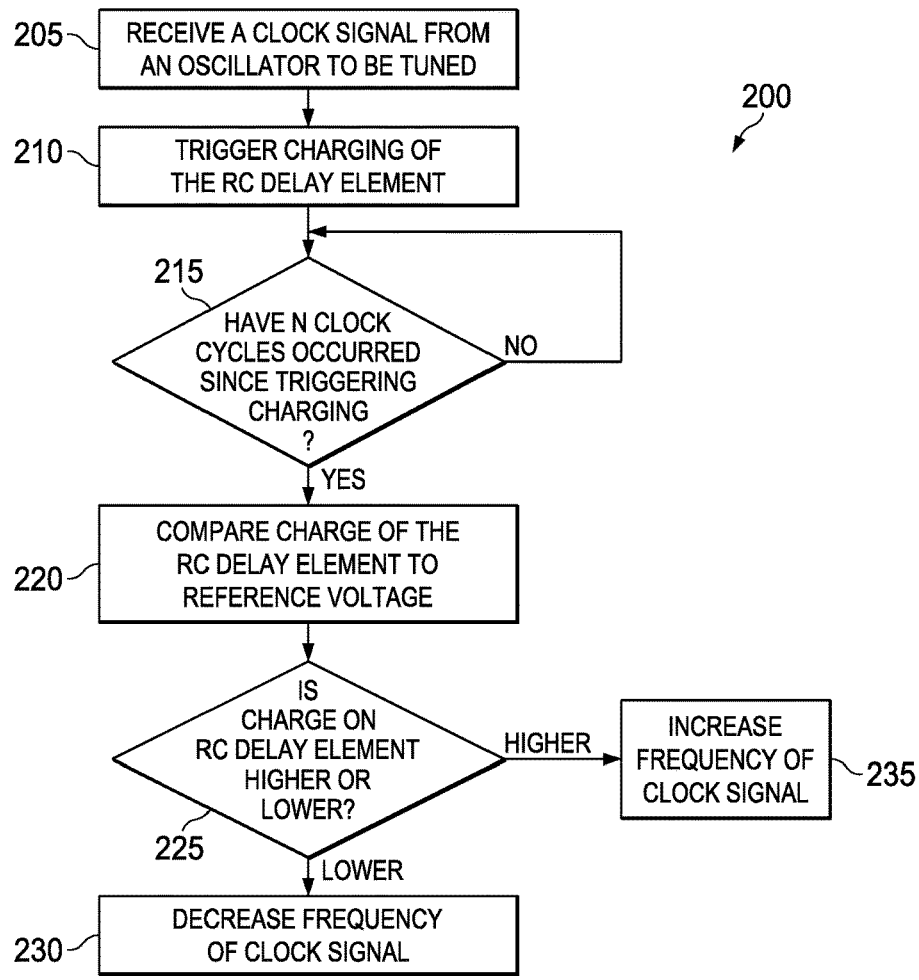
FIG. 2 depicts an example flowchart of a method of tuning an internal DCO to ultra-high precision according to an embodiment of the present patent application.

FTM 112 controls the self-calibration process 200 of DCO 116, which will now be described with reference to FIG. 2. FTM 112 receives (205) the clock signal from DCO 116, which has a period of 'tclk'. FTM 112 triggers (210) signal 130, which causes precision RC delay element 102 to charge at a controlled rate. FTM 112 can be provided with the value of N to be used. FTM 112 then determines (215)

whether N clock cycles have occurred since triggering the charging. After exactly 'N' clocks, FTM 112 triggers clock input 132 and obtains the results of comparator 110, which compares (220) the charge on precision RC delay element 102 to Vref. FTM 112 determines (225) whether the result of comparator 134 is 'High' or 'Low'. If the result is High, then in N*tclk time, RC delay element 102 charged more than Vref; therefore N*tclk>Tref. If the result is Low, then in N*tclk time, RC delay element 102 charged less than Vref; therefore N*tclk<Tref. Based on the comparator result, FTM 112 gives corrective feedback to DCO 116. In this example, if the result is low, FTM 112 decreases (230) the frequency of the clock signal; if the result is high, FTM 112 increases (235) the frequency. At steady state, clock period 'tclk' will be hovering around 'Tref/N', depending on the steps of the DCO. It is easy to achieve small steps in a DCO, so if we are able to assume that DCO steps are negligible, then tclk will approximately equal Tref/N. The accuracy of the final frequency will be approximately equal to 1/N when DCO steps are sufficiently smaller than 1/N. Although the operation of the precision RC delay module has been described in terms of "counts", i.e. as a number of clock periods necessary for the RC delay module to charge, it will be understood by one skilled in the art that the operation of the circuit can also be defined purely in terms of the time necessary for RC delay module to be charged without departing from the spirit of the disclosure. Similarly, although the circuit has been described as a charge circuit, one skilled in the art will understand that the circuit can also be realized as a discharge circuit without departing from the spirit of the disclosure.

Figure 3:
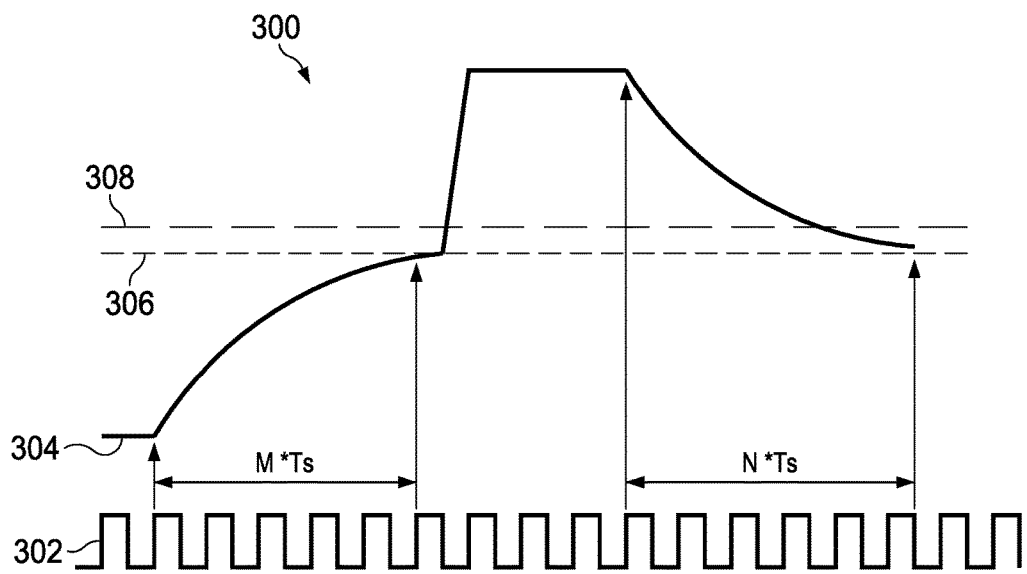
FIG. 3 depicts an example of the timing of a dual charge/discharge method for operation of the RC circuit according to an embodiment of the present patent application.

Offset in elements of a circuit can be defined in terms of a difference between a design or initial value of a result and a current value of the same result. Although the initial offset of the RC delay element is taken into account in defining the value of N, in at least one embodiment, the offset impact of comparator 110 changes over time, causing a drift of precision RC delay element 102 that requires correction. This correction can be implemented by using a dual charge/discharge method, the timing of which is illustrated in FIG. 3. In timing diagram 300, the previous variable 'N' is replaced by two variables 'M' and 'N', where M and N together determine the size of the steps that are attainable in tuning DCO 116. In this embodiment, M represents the number of clocks during which precision RC delay element 102 is charged at a precise rate, while N represents the number of clocks during which precision RC delay element 102 is discharged at a precise rate. It will be understood that clock signal 302 is the clock received from DCO 116, while line 304 represents the charge on capacitor 108. Dotted line 306 represents the value of Vref. When the clock of DCO 116 is correctly tuned, capacitor 108 charges to Vref in M clocks and discharges in N clocks. In an example embodiment, comparator 110 has drifted such that line 308 represents the offset of comparator 110.

Figure 4:
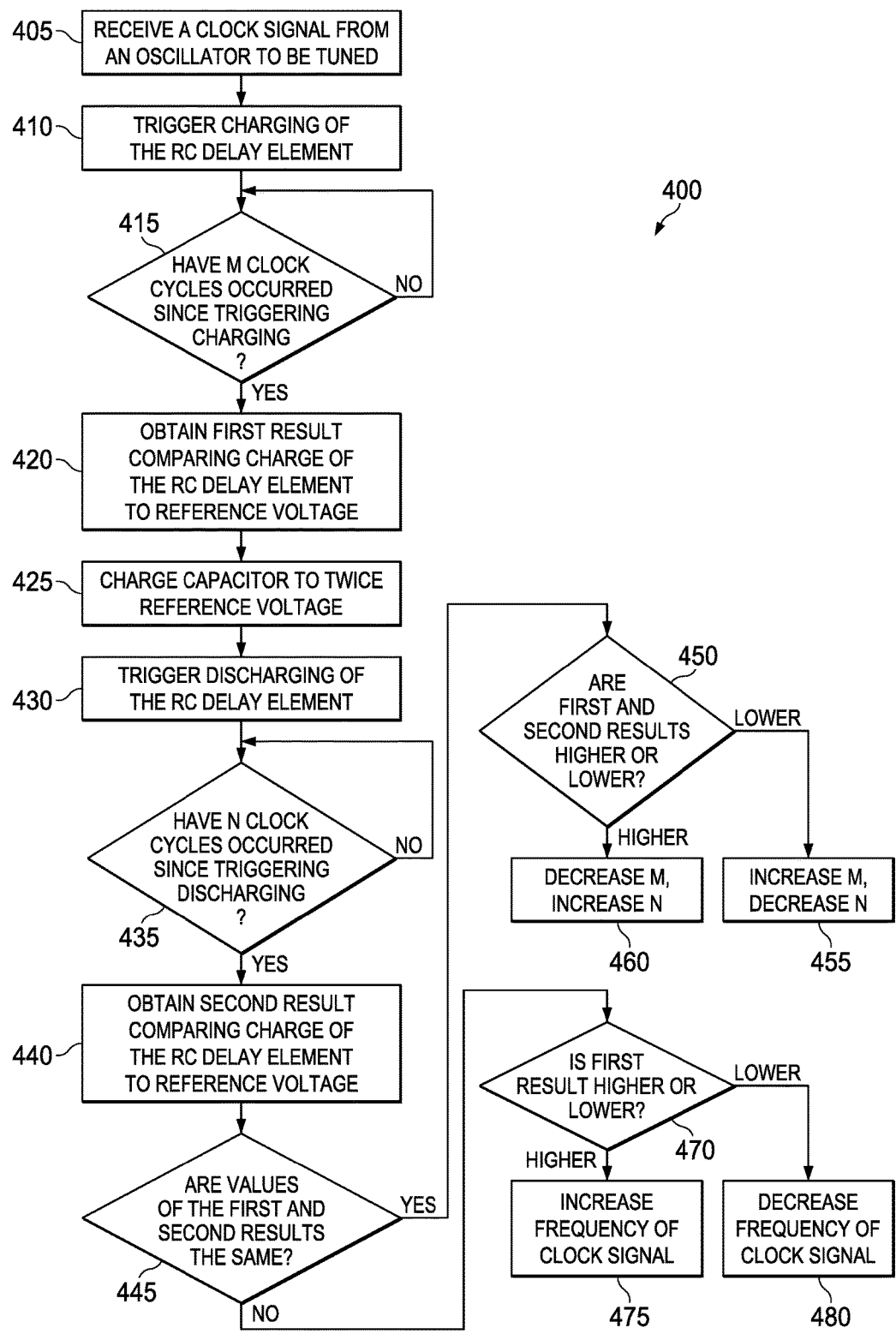
FIG. 4 depicts an example flowchart of a method of tuning an internal DCO to ultra-high precision according to a dual charge/discharge embodiment of the present patent application.

The method that is represented by timing diagram 300 will now be described with reference to flowchart 400 of FIG. 4. In this figure, FTM 112 receives (405) the clock signal from DCO 116 and triggers signal 130 to begin charging (410) precision RC delay element 102 at a controlled rate. As shown in FIG. 3, signal 130 is triggered at the start of a clock cycle. FTM 112 determines (415) whether M clock cycles have occurred since triggering the charging and waits if M clock cycles have not yet occurred. After exactly M clocks, FTM 112 triggers clock input 132 to comparator 110 and obtains (420) a first result of the comparator. FTM 112 then opens a switch (not specifically shown) to quickly charge (425) the capacitor to twice the reference voltage. Once capacitor 108 is fully charged, FTM 112 triggers (430) the discharging of precision RC delay element 102 at the controlled rate. Note that the discharge also begins at the start of a clock cycle. FTM 112 then determines (435) whether N clock cycles have occurred since triggering the discharging and waits until this condition has occurred. After exactly N clock cycles, FTM 112 obtains (440) a second result from comparator 110. One skilled in the art will recognize that although the discharge circuit has been disclosed as charging to twice the reference voltage, other voltages can also be used in the discharge phase, e.g., three times the reference voltage, as long as the time for discharging is known.

Once FTM 112 has the values of the first and second results, FTM 112 determines (445) whether the two values are the same. If the two results agree with each other, FTM 112 will shift the values of M and N to correct the offset and if the two results disagree, FTM 112 will adjust the DCO frequency. As shown, when the two result values are the same, FTM 112 next determines (450) whether both results are high or low. If both results are low, FTM 112 increases (455) the value of M by a given amount and decreases the value of N by the same amount to correct the offset. If both results are high, FTM 112 decreases (460) the value of M by the given amount and increases the value of N by the same given amount. If the first and second results are different from each other, FTM 112 determines (470) whether the first result is high or low. If the first result is high, FTM 112 increases (475) the frequency of DCO 116's clock signal, thereby decreasing its period, tclk. If the first result is low, FTM 112 decreases (480) the frequency of DCO 116's clock signal, thereby increasing its period, tclk. This decision process is represented in Table 1 shown below.

TABLE 1

| Comparator O/P | | | Corrective | |
| --- | --- | --- | --- | --- |
| Chrg | Dischrg | Explanation | Action | Effect |
| L | L | Needs more charging and less discharging | Increase M, decrease N | Offset Correction |
| L | H | Needs more charging and more discharging | Increase tclk | Frequency Correction |
| H | L | Needs less charging and less discharging | Decrease tclk | Frequency Correction |
| H | H | Needs less charging and more discharging | Decrease M, increase N | Offset Correction |

At steady state, $$T_S = -\frac{RC}{m}\log_e\left(1 - \alpha - \frac{V_{OS}}{V_{DD}}\right) = -\frac{RC}{n}\log_e\left(\alpha + \frac{V_{OS}}{V_{DD}}\right)$$

where $T_S$ is equal to tclk, and
$V_{OS}$ is the offset voltage.
If we assume $\alpha=\frac{1}{2}$ (this value provides the maximum sensitivity for frequency shift and easier comparator design), we can write, $$(mT_S + nT_S) = -RC\log_e\left(\frac{1}{2} - \frac{V_{OS}}{V_{DD}}\right) - RC\log_e\left(\frac{1}{2} + \frac{V_{OS}}{V_{DD}}\right)$$

$$\Rightarrow T_S = -\frac{RC}{m+n}\log_e\left(\frac{1}{4} - \left(\frac{V_{OS}}{V_{DD}}\right)^2\right)$$

To achieve $T_S$ variation of less than 0.1% at Vdd=1.1V, the comparator offset must be less than ±20 mV. This value is highly relaxed compared to an offset of less than ±381 uV using current methods. Note that the final tuned frequency depends on (M+N), not on their individual values.

The time needed for start-up and tuning of an oscillator can be traded off with initial tuning accuracy. For example achieving 1% accuracy requires only about 100 clocks per step, but to achieve 0.1% accuracy requires around 1000 clocks per step. In at least one embodiment, a system is configured with very fast start-up that achieves within 5% accuracy and then slowly converges to very high accuracy, e.g. about 0.1%. The tuning logic and associated delay elements need only run during frequency tuning; at all other times, these elements can be powered down.

Figure 5:
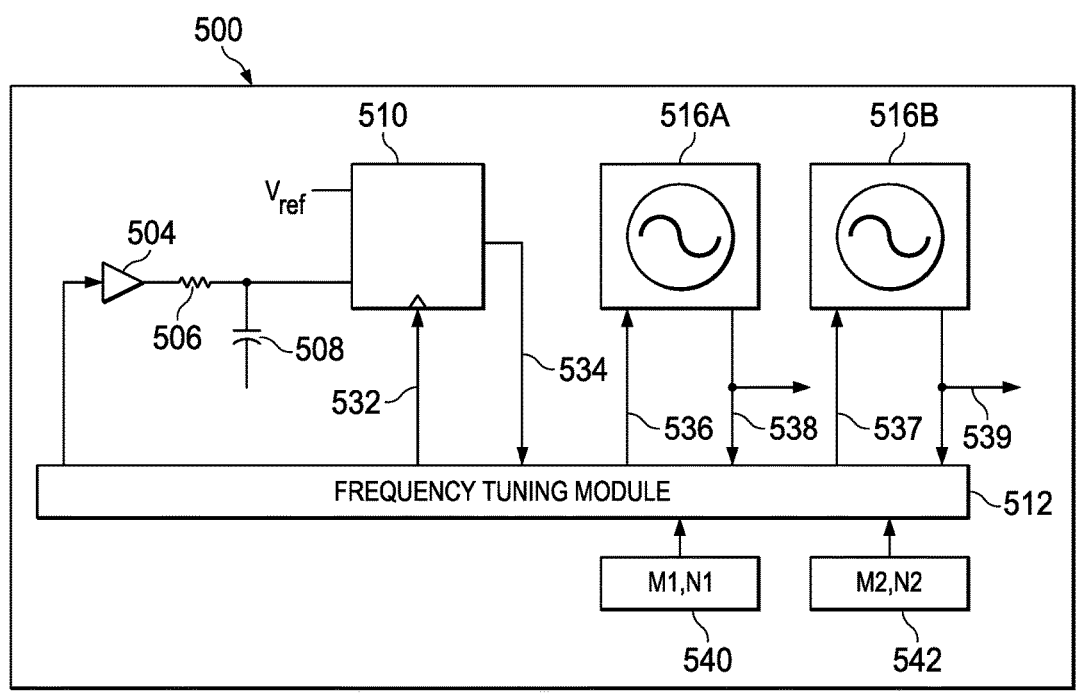
FIG. 5 depicts an example chip containing multiple internal DCOs and the circuits to tune those internal DCOs to ultra-high precision according to an embodiment of the present patent application.

Applicants note that the same delay element and associated frequency tuning capabilities can be used by multiple oscillators on an integrated circuit (IC) chip, with each oscillator being tuned to a different frequency. An embodiment of this implementation is illustrated in FIG. 5. IC chip 500 of FIG. 5 generally corresponds to FIG. 1 and contains similar numbering for the elements, so the details of this figure will not be explicitly discussed herein except as necessary. It will be understood that although IC chip 500 is shown as containing only the DCOs and associated tuning modules, other circuits (not specifically shown) are provided on IC chip 500 to accomplish numerous tasks. Additionally, although two DCO 516A, 516B are shown in this figure, with corresponding control lines 536, 537 and clock outputs 538, 539, it will be understood that any number of DCOs can be connected to FTM 512. FTM 512 only needs to receive the clock from each DCO, to have a control line to each DCO, and to receive inputs 540, 542 containing appropriate values for M and N for each DCO. Notably, each clock connection can be shut down while not tuning. Accordingly, there is minimum concern about clock coupling. It will also be understood that if one oscillator with frequency f1 is tuned with code k1, the relationship between the frequency and the code remains constant for that IC chip, i.e.:

$$f_n = \frac{(k1 * f1)}{k_n}$$

where codes k1 and kn refer to the counts utilized herein in tuning the frequency, i.e., the value of N when the dual charge/discharge method is not utilized and the values of M and N when the dual charge/discharge method is used. Notably, an oscillator can be re-tuned to a different frequency following this equation. The ability to "trim" multiple oscillators with a single "logical" trim operation on the RC module equates to lower test cost for the IC chip.

In the above-description of various embodiments of the present disclosure, it is to be understood that the terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and may not be interpreted in an idealized or overly formal sense expressly so defined herein.

At least some example embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. Such computer program instructions may be provided to a processor circuit of a general purpose computer circuit, special purpose computer circuit, and/or other programmable data processing circuit to produce a machine, so that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). Additionally, the computer program instructions may also be stored in a non-transitory tangible computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

It should be understood that the order or sequence of the acts, steps, functions, components or blocks illustrated in any of the flowcharts depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart and/or block diagram in order to effectuate additional variations, modifications and configurations with respect to one or more processes for purposes of practicing the teachings of the present patent disclosure.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method comprising:
   receiving a clock signal from an oscillator;
   charging an RC delay element for a predetermined number of cycles of the clock signal, the RC delay element comprises a resistor, a capacitor, and a comparator;
   comparing a voltage on the RC delay element to a first reference voltage;

changing a frequency of the clock signal based at least in part on the comparison; and charging the RC delay element to a second reference voltage and discharging the RC delay element, wherein the second reference voltage is greater than the first reference voltage.

2. The method as recited in claim 1 further comprising repeating the receiving, the charging, the comparing and the changing until the frequency stabilizes.

3. The method as recited in claim 2 further comprising:
determining a time that is necessary to charge the RC delay element to the reference voltage;
calculating a period of a signal having the frequency; and
calculating M equal to the time divided by the period.

4. The method as recited in claim 3 further comprising disconnecting from the oscillator, connecting to a second oscillator, and tuning the second oscillator to a second frequency that is different from the frequency.

5. An integrated circuit (IC) chip comprising:
a frequency tuning module adapted to be coupled to an oscillator; and
a RC delay element coupled to the frequency tuning module and comprising a digital buffer, a resistor, a capacitor, and a comparator, the resistor being connected between the digital buffer and a first input of the comparator, a second input of the comparator receiving a reference voltage, and the capacitor having a terminal connected between the resistor and the first input of the comparator;
wherein the frequency tuning module is configured to:
receive a clock signal from the oscillator;
charge the RC delay element for a predetermined number of cycles of the clock signal;
compare a voltage on the RC delay element to a first reference voltage;
change a frequency of the clock signal based on the comparison; and
charge the RC delay element to a second reference voltage and discharge the RC delay element, wherein the second reference voltage is greater than the first reference voltage.

6. The IC chip as recited in claim 5 wherein no trimming operations are performed on the capacitor and the resistor.

7. The IC chip as recited in claim 5 wherein the IC chip comprises a plurality of oscillators, each oscillator being coupled to provide a clock signal to the frequency tuning module.

8. The IC chip as recited in claim 7 wherein each of the plurality of oscillators is only connected to the frequency tuning module during tuning of the respective oscillator.

9. A method comprising:
receiving a clock signal from an oscillator;
charging an RC delay element for a first predetermined number of clock cycles of the clock signal, the RC delay element comprising a resistor, a capacitor, and a comparator;
first comparing a voltage on the RC delay element, after the charging, to a first reference voltage;
charging the RC delay element to a second reference voltage, and discharging the RC delay element for a second predetermined number of clock cycles, wherein the second reference voltage is higher than the first reference voltage;
second comparing a voltage on the RC delay element, after the discharging, to the first reference voltage;
changing a frequency of the clock signal in at least partial dependence on the first comparing and the second comparing.

10. The method of claim 9, further comprising changing the first predetermined number and the second predetermined number in at least partial dependence on the first comparing and the second comparing.

11. The method of claim 9, further comprising repeating the receiving, the charging for a first predetermined number of clock cycles, the first comparing, the charging to a second reference voltage, the second comparing, and the changing until the frequency stabilizes.

12. The method as recited in claim 9, further comprising disconnecting the RC delay element from the oscillator, connecting the RC delay element to a second oscillator, and tuning the second oscillator to a second frequency that is different from the frequency.

* * * * *